United States Patent
Su

(10) Patent No.: US 9,472,426 B2
(45) Date of Patent: Oct. 18, 2016

(54) PACKAGING SUBSTRATE AND METHOD FOR MANUFACTURING SAME

(71) Applicant: Zhen Ding Technology Co., Ltd., Tayuan, Taoyuan (TW)

(72) Inventor: Wei-Shuo Su, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/841,721

(22) Filed: Sep. 1, 2015

(65) Prior Publication Data

US 2015/0371873 A1    Dec. 24, 2015

Related U.S. Application Data

(62) Division of application No. 14/140,461, filed on Dec. 24, 2013, now Pat. No. 9,159,614.

(30) Foreign Application Priority Data

Jun. 11, 2013   (CN) .......................... 2013 1 0230281

(51) Int. Cl.
| | |
|---|---|
| *H01L 21/48* | (2006.01) |
| *H01L 21/768* | (2006.01) |
| *H01L 23/498* | (2006.01) |
| *H01L 21/683* | (2006.01) |

(52) U.S. Cl.
CPC ....... *H01L 21/4853* (2013.01); *H01L 21/4828* (2013.01); *H01L 21/4857* (2013.01); *H01L 21/6835* (2013.01); *H01L 21/76879* (2013.01); *H01L 23/49822* (2013.01); *H01L 2221/68318* (2013.01); *H01L 2221/68345* (2013.01); *H01L 2221/68377* (2013.01); *H01L 2924/0002* (2013.01)

(58) Field of Classification Search
CPC .......... H01L 21/4853; H01L 21/4828; H01L 21/4857; H01L 21/6835; H01L 21/76879; H01L 23/49822
See application file for complete search history.

(56) References Cited

U.S. PATENT DOCUMENTS

| | | | | |
|---|---|---|---|---|
| 2003/0011070 A1* | 1/2003 | Iijima | ................ | H01L 21/4857 257/734 |
| 2008/0188037 A1 | 8/2008 | Lin | | |
| 2008/0257596 A1* | 10/2008 | Kaneko | ............... | H01L 21/4857 174/264 |

(Continued)

FOREIGN PATENT DOCUMENTS

CN           101578929 A         11/2009

*Primary Examiner* — Duy Deo
(74) *Attorney, Agent, or Firm* — Zhigang Ma

(57) ABSTRACT

A method for manufacturing a packaging substrate includes: patterning a first photo-resisting layer having first openings on a copper foil layer to expose portions of the copper foil layer; patterning a removable second photo-resisting layer having second openings on the first photo-resisting layer to expose the first openings; filling copper into the first and second openings to form base portions and a first wiring layer; orderly forming a first dielectric layer and a second wiring layer on the first wiring layer; patterning a removable third photo-resisting layer comprising covering portions opposite to the base portions on the copper foil layer; and etching the copper foil layer to form protruding portions connected to and corresponding to the base portions to define a copper pillar bump, a size of the copper pillar bump gradually increasing from the protruding portions to the base portions.

8 Claims, 13 Drawing Sheets

(56) References Cited

U.S. PATENT DOCUMENTS

2010/0175917 A1* 7/2010 Miyasaka ......... H01L 23/49838 174/266

2012/0112345 A1* 5/2012 Blackwell ........... H01L 21/4857 257/738

2012/0234589 A1* 9/2012 Furuichi .............. H05K 3/4682 174/261

* cited by examiner

PACKAGING SUBSTRATE AND METHOD FOR MANUFACTURING SAME

This application is a divisional application of a commonly-assigned application entitled "PACKAGING SUBSTRATE AND METHOD FOR MANUFACTURING SAME", filed on Dec. 24, 2013 with application Ser. No. 14/140,461. The disclosure of the above-identified application is incorporated herein by reference.

FIELD

The present disclosure relates to a packaging substrate and a method for manufacturing the same.

BACKGROUND

Packaging substrates generally include a wiring layer, a solder masking layer formed on the wiring layer, and a photo-resisting layer formed on the solder masking layer. A number of first openings is defined in the solder masking layer to expose portions of the wiring layer. The portions of the wiring layer exposed through the first openings serve as contact pads. A number of second openings communicating with the first openings is defined in the photo-resisting layer. A copper layer is plated in each pair of the first opening and the second opening by an electroplating method. The photo-resisting layer is removed from the solder masking layer, and the copper layer plated in each pair of the first opening and the second opening forms a copper portion protruding past the solder masking layer.

As inner diameters of the first opening and the second opening are relatively small, the inner diameter of the second opening is designed to be greater than the inner diameter of the first opening in order to improve an alignment accuracy, which increases an interval between two adjacent copper portions.

Therefore, it is desirable to provide a packaging substrate and a method for manufacturing the same that can overcome the limitations described.

BRIEF DESCRIPTION OF THE DRAWINGS

Implementations of the present technology will now be described, by way of example only, with reference to the attached figures.

DETAILED DESCRIPTION

Figure 1:
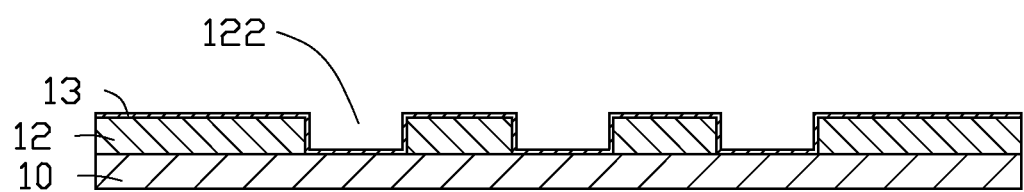
FIG. 1 is a cross-sectional view of a first embodiment of a first photo-resisting layer formed on a copper foil layer.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a method for manufacturing a packaging substrate, comprising: patterning a first photo-resisting layer on a copper foil layer, the first photo-resisting layer defining a plurality of first openings to expose portions of the copper foil layer; patterning a second photo-resisting layer on the first photo-resisting layer, the patterned second photo-resisting layer defining a plurality of second openings exposing the first openings; filling copper into the first openings and the second openings, with base portions formed in the first openings and a first wiring layer in the second openings; removing the second photo-resisting layer; orderly forming a first dielectric layer and a second wiring layer on the first wiring layer; patterning a third photo-resisting layer on the copper foil layer, the third photo-resisting layer facing away from the first photo-resisting layer, the third photo-resisting layer comprising a plurality of covering portions opposite to the base portions, and a size of each covering portion being less than a size of the corresponding base portion; etching the copper foil layer to form a plurality of protruding portions connected to the base portions, each of the protruding portions spatially corresponding to a respective one of the base portions, each pair of base portion and protruding portion forming a copper pillar bump, a size of the copper pillar bump gradually increasing from the protruding portions to the base portions; and removing the third photo-resisting layer.

FIGS. 1-10 show an embodiment of a method for manufacturing a packaging substrate 100. The method includes seven steps.

In the first step, referring to FIG. 1, a first photo-resisting layer 12 is formed on a copper foil layer 10 an patterned. The first photo-resisting layer 12 defines a plurality of first openings 122 to expose portions of the copper foil layer 10. A first conductive layer 13 is continuously formed on exposed surfaces of the first photo-resisting layer 12 and the copper foil layer 10. The first conductive layer 13 is formed via an electroless plating process.

In the embodiment, the first photo-resisting layer 12 can be formed by a method of spreading, curing, and patterning a liquid photoresist ink, or by a method of pressing and patterning a dry film photoresist. The electroless plating process can be a chemical plating process.

Figure 2:
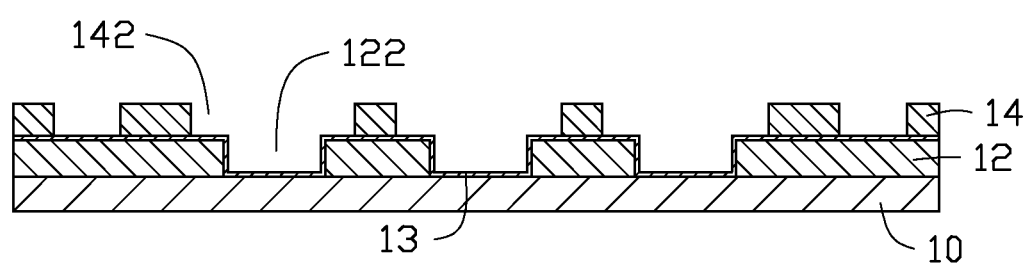
FIG. 2 is a cross-sectional view of a second photo-resisting layer formed on the first photo-resisting layer of FIG. 1.

In the second step, referring to FIG. 2, a second photo-resisting layer 14 is formed on portions of the first conductive layer 13 formed on the first photo-resisting layer 12 and patterned.

In the embodiment, the second photo-resisting layer 14 defines a plurality of second openings 142. Each first opening 122 communicates with a second opening 142, and a size of each second opening 142 is greater than a size of the first opening 122. Thus, portions of the first conductive layer 13 formed on the first photo-resisting layer 12 are not covered by the second photo-resisting layer 14 and are exposed. The first conductive layer 13 is used as a seed layer.

Figure 3:
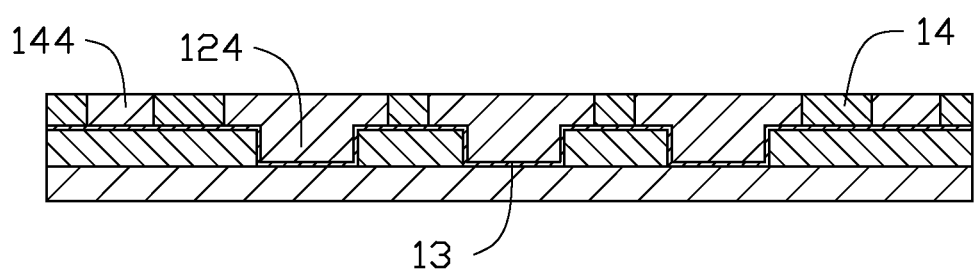
FIG. 3 is a cross-sectional view of an electroplating layer plated in openings defined by the first photo-resisting layer and the second photo-resisting layer of FIG. 2 to form a base portion and a first wiring layer.

In the third step, referring to FIG. 3, copper is filled in the first openings 122 and the second openings 142 via an electroplating process. The copper filled in the first openings 122 forms a base portion 124, and the copper filled in the second openings 142 forms a first wiring layer 144.

Figure 4:
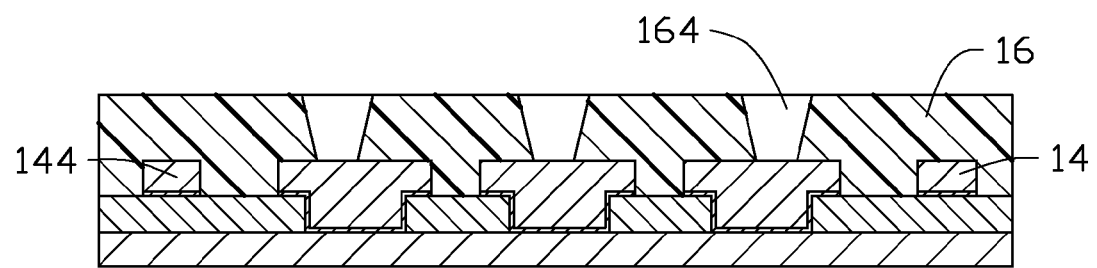
FIG. 4 is a cross-sectional view of the second photo-resisting layer removed and a first dielectric layer formed on the first photo-resisting layer of FIG. 3.
Figure 5:
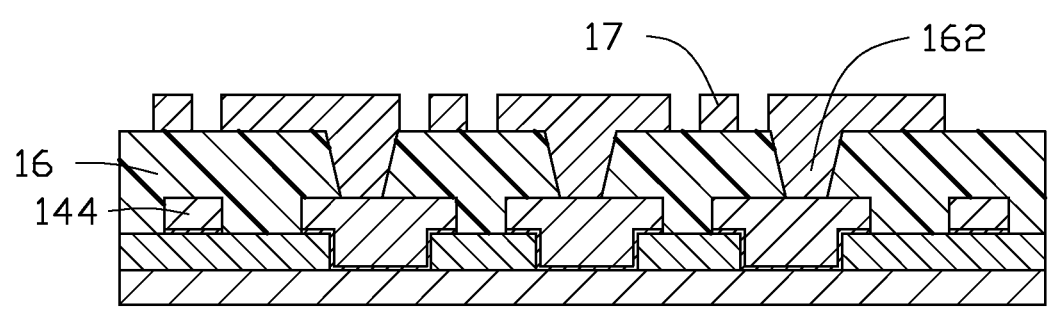
FIG. 5 is a cross-sectional view of a second wiring layer formed on the first dielectric layer of FIG. 4.

In the fourth step, referring to FIGS. 4-5, the second photo-resisting layer 14 and portions of the first conductive layer 13 covered by the second photo-resisting layer 14 are removed. A first dielectric layer 16 and a second wiring layer 17 are orderly formed on the first wiring layer 144.

In the embodiment, the second photo-resisting layer 14 is removed via a stripping process, and the first conductive layer 13 is removed via a flash-rusting process. The first dielectric layer 16 is formed on the first wiring layer 144 via a pressing process, and the first dielectric layer 16 fills in gaps defined by removing the second photo-resisting layer 14 and the portions of the first conductive layer 13. The first wiring layer 144 is electrically connected to the second wiring layer 17 via first conductive via-holes 162. The second wiring layer 17 and the first conductive via-holes 162 are formed via a semi-additive process. A plurality of blind holes 164 is defined in the first dielectric layer 16. The blind holes 164 expose portions of the wiring layer 144. A seed layer (not shown) is continuously formed along exposed surfaces of the first dielectric layer 16, inner surfaces of the bind holes 164, and exposed surfaces of the first wiring layer 144. The seed layer is formed via the electroless plating process. A patterned photo-resisting layer (not shown) is formed on the seed layer, such that portions of the seed layer and the blind holes 164 are exposed from the patterned photo-resisting layer. Copper is filled in the blind holes 164 and formed on the portions of the seed layer exposed from the patterned photo-resisting layer. The copper is formed via the electroplate process. The copper filled in the blind holes 164 forms the first conductive via-holes 162, and the copper formed on the seed layer forms the second wiring layer 17.

It should be understood that if the first conductive layer 13 of the first step is omitted, the first conductive layer 13 will not be flash-rusted in the fourth step. The first photo-resisting layer 12 and the second photo-resisting layer 14 are made of different materials, so a stripping liquid used to remove the second photo-resisting layer 14 will not affect the first photo-resisting layer 12. The second wiring layer 17 can be formed by etching a copper layer, and the first conductive via-holes 162 can be formed by a hole-filling process.

Figure 6:
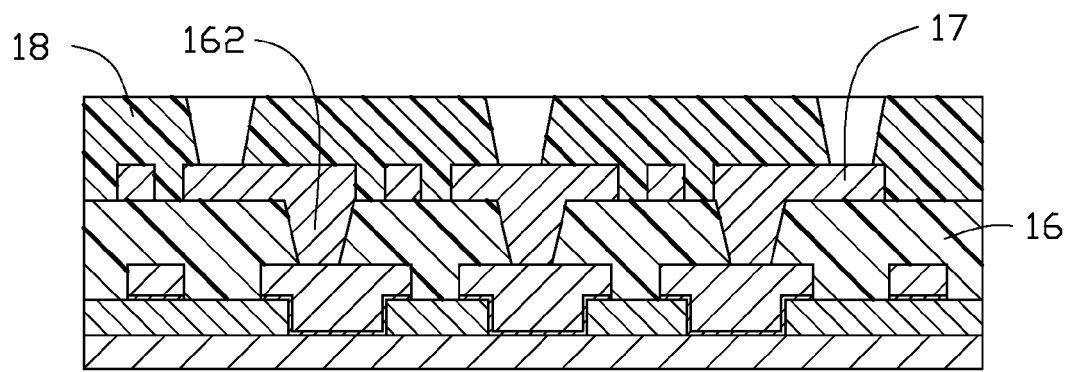
FIG. 6 is a cross-sectional view of a second dielectric layer formed on the second wiring layer of FIG. 5.
Figure 7:
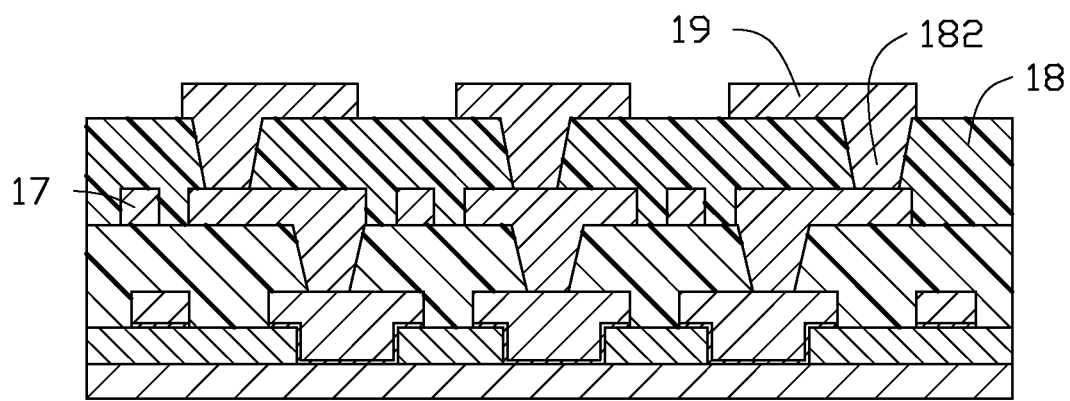
FIG. 7 is a cross-sectional view of a third wiring layer formed on the second dielectric layer of FIG. 6.

In the fifth step, referring to FIGS. 6-7, a second dielectric layer 18 and a third wiring layer 19 are formed on the second wiring layer 17. The second wiring layer 17 is electrically connected to the third wiring layer 19 via second conductive via-holes 182 formed in the second dielectric layer 18. The second dielectric layer 18, the second conductive via-holes 182, and the third wiring layer 19 are formed the same way as the first dielectric layer 16, the first conductive via-holes 162, and the second wiring layer 17 of the fourth step.

Figure 8:
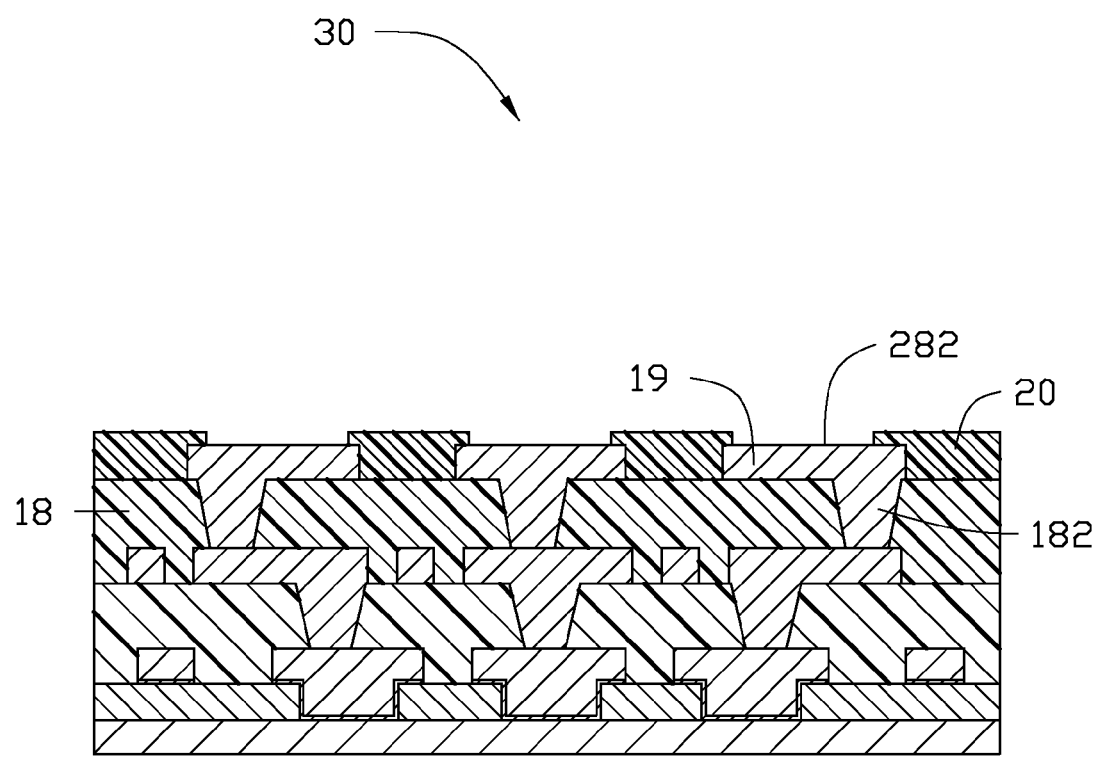
FIG. 8 is a cross-sectional view of a solder masking layer formed on the third wiring layer of FIG. 7.

In the sixth step, referring to FIG. 8, a solder masking layer 20 is formed on the third wiring layer 19 and the second dielectric layer 18. A plurality of openings (not labeled) is defined in the solder masking layer 20. Parts of the third wiring layer 19 exposed from the openings serve as solder pads 282. The copper foil layer 10, the first photo-resisting layer 12, the first wiring layer 144, the first dielectric layer 16, the second wiring layer 17, the second dielectric layer 18, the third wiring layer 19, and the solder masking layer 20 form a multilayer substrate 30.

In the embodiment, the solder pads 282 are used for connecting to chips (not labeled) or circuit boards (not labeled) via solder balls (not labeled).

Figure 9:
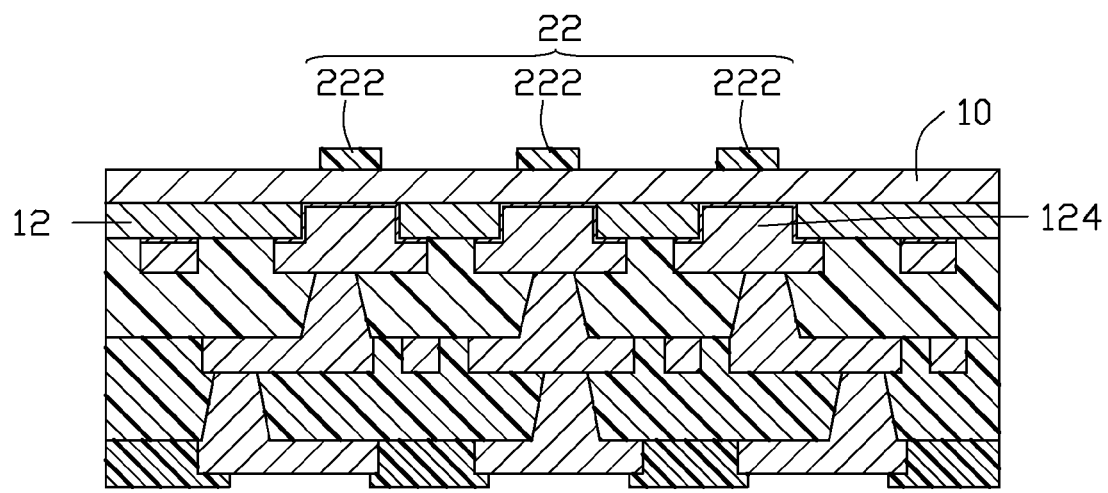
FIG. 9 is a cross-sectional view of a third photo-resisting layer formed on the copper foil layer of FIG. 8.
Figure 10:
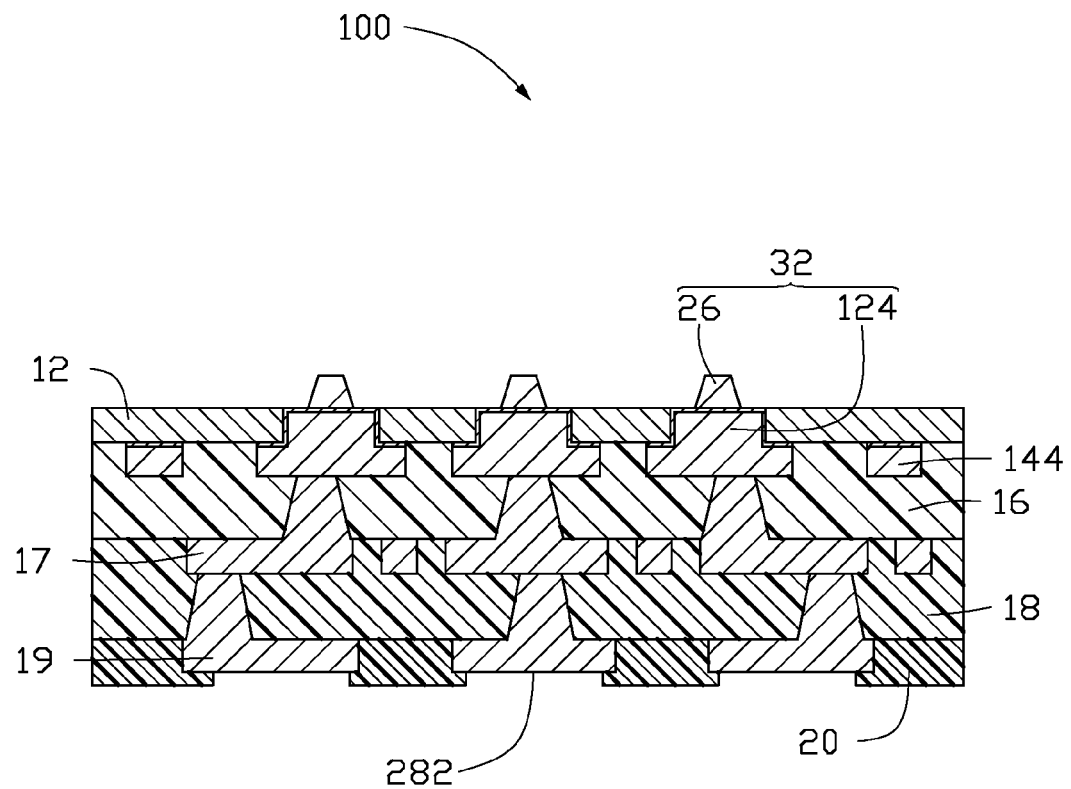
FIG. 10 is a cross-sectional view of a packaging substrate in which the copper foil layer of FIG. 9 is etched.

In the seventh step, referring to FIGS. 9-10, the multilayer substrate 30 is turned over, and a third photo-resisting layer 22 is formed on an exposed side of the copper foil layer 10 and patterned. The third photo-resisting layer 22 includes a plurality of covering portions 222. The covering portions 222 correspond to the base portions 124, and a size of each covering portion 222 is less than a size of the corresponding base portion 124. Exposed portions of the copper foil layer 10 are etched, and the third photo-resisting layer 22 is removed, to form a plurality of protruding portions 26 connected to the base portion 124. Each base portion 124 connected to a protruding portion 26 forms a copper pillar bump 32. A width of the copper pillar bump 32 gradually increases from a distal end thereof to the base portion 124.

In the embodiment, the third photo-resisting layer 22 can be formed by a method of spreading, curing, and patterning a liquid photoresist ink, a method of pressing and patterning a dry film photoresist, or a method of spurting the liquid photoresist ink on portions of the copper foil layer 10.

During the process of etching the copper foil layer 10, as the copper foil layer 10 is etched along a direction from the photo-resisting layer 22 to the base portion 124, portions of the copper foil layer 10 adjacent to the covering portions 222 are more easily etched than the portions of the copper foil layer 10 adjacent to the base portion 124. Thus, the width of the protruding portions 26 gradually increases from the covering portions 222 to the base portion 124, and a cross-section of the protruding portions 26 is substantially an isosceles trapezoid. A size of the protruding portion 26 is less than a size of the base portion 124, and an area of a bottom surface of the protruding portion 26 adjacent to the base portion 124 is less than an area of a top surface of the base portion 124 adjacent to the protruding portion 26.

FIG. 10 shows the packaging substrate 100 including the first wiring layer 144, the first dielectric layer 16, the second wiring layer 17, the second dielectric layer 18, the third wiring layer 19, the solder masking layer 20, the first photo-resisting layer 12, and a plurality of copper pillar bumps 32. The first photo-resisting layer 12, the first wiring layer 144, the first dielectric layer 16, the second wiring layer 17, the second dielectric layer 18, the third wiring layer 19, and the solder masking layer 20 are orderly stacked. The first wiring layer 144 is electrically connected to the second wiring layer 17 via the first conductive via-holes 162 formed in the first dielectric layer 16. The second wiring layer 17 is electrically connected to the third wiring layer 19 via the second conductive via-holes 182 formed in the second dielectric layer 18. The parts of the third wiring layer 19 exposed from the solder masking layer 20 serve as the solder pads 282. Each copper pillar bump 32 includes the base portion 124 and the protruding portion 26. The base portions 124 are formed in the first openings 122 defined in the first photo-resisting layer 12, and the protruding portions 26 are formed on the base portions 124. The size of the protruding portions 26 is less than the size of the base portions 124, and an area of a bottom surface of the protruding portion 26 adjacent to the base portion 124 is less than an area of a top surface of the base portion 124 adjacent to the protruding portion 26. The copper pillar bumps 32 are used to electrically connect to pins of a chip (not shown).

It should be understood that the first photo-resisting layer 12 can be removed after the third photo-resisting layer 22 is removed. A plurality of dielectric layers and wiring layers can be formed on the third wiring layer 19 after the third wiring layer 19 is formed. Therefore, the number of the wiring layers of the packaging substrate 100 is increased.

Figure 11:
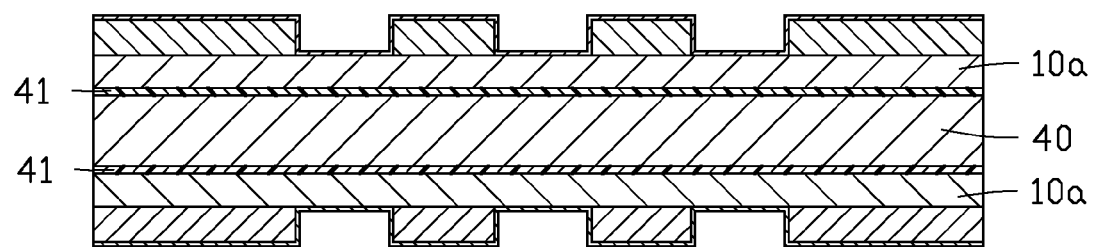
FIG. 11 is a cross-sectional view of a second embodiment of two copper foil layers formed on two opposite surfaces of a supporting plate.
Figure 12:
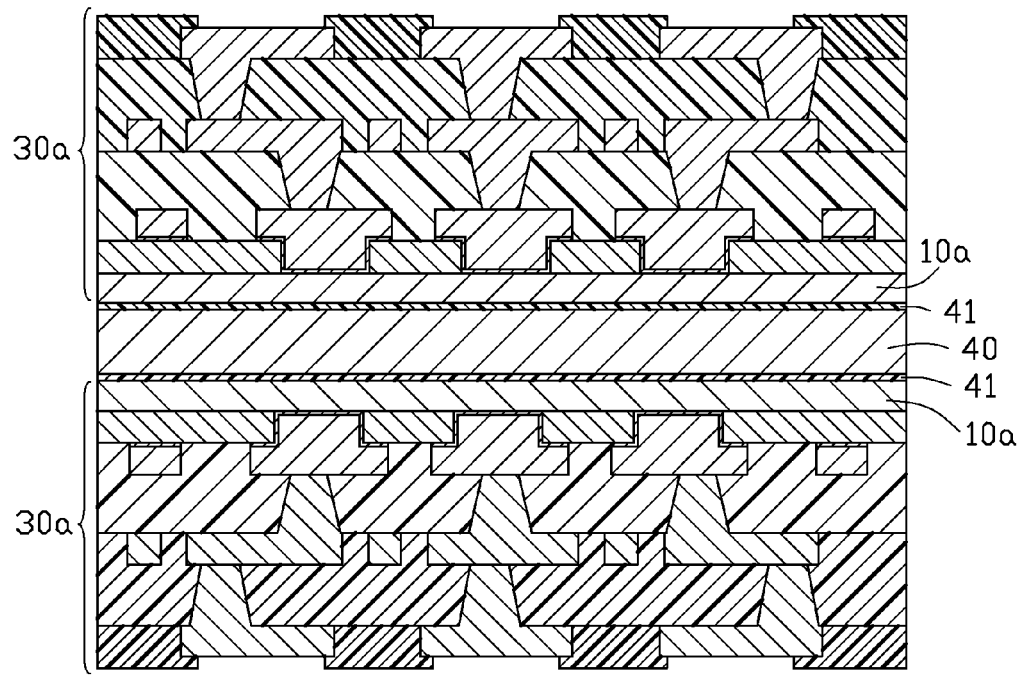
FIG. 12 is a cross-sectional view of two multilayer substrates formed on two opposite surface of the supporting plate of FIG. 11, wherein each multilayer substrate includes a copper foil layer, a first photo-resisting layer, a first wiring layer, a first dielectric layer, a second wiring layer, a second dielectric layer, a third wiring layer, and a solder masking layer.
Figure 13:
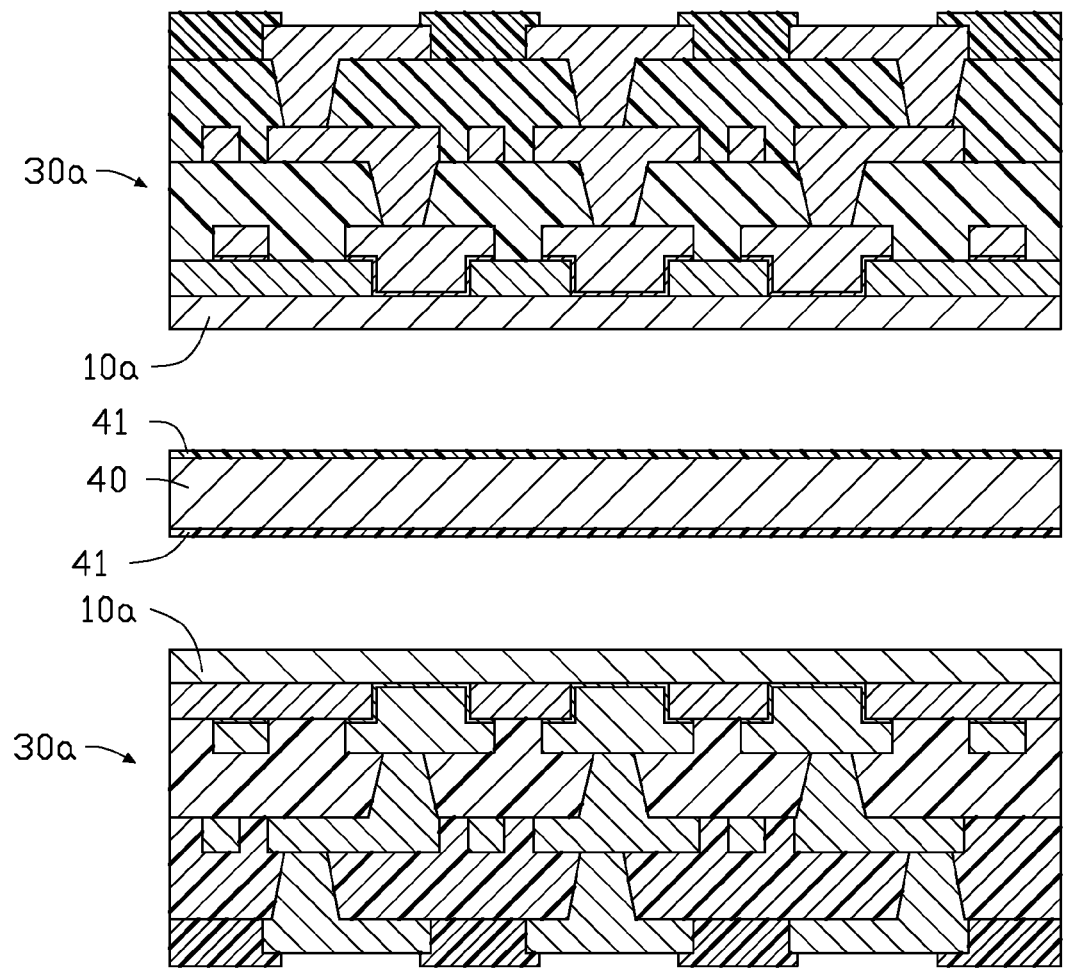
FIG. 13 is a cross-sectional view of two multilayer substrates of FIG. 12 separated from the supporting plate.

FIGS. 11-13 show a second embodiment of a method for manufacturing a packaging substrate 100.

A supporting plate 40 and two release films 41 attached on two sides of the supporting plate 40 are provided. Two copper foil layers 10*a* are covered on the two release films 41 respectively. The supporting plate 40 is used to support the two copper foil layers 10*a*. The supporting plate 40 is made of polyimide, glass-fiber laminate, or metal. The release film 41 is a double faced film, and is made of PET. The release film 41 is adhered between the copper foil layers 10*a* and the supporting plate 40.

Two multilayer substrates 30*a* are formed on the two copper foil layers 10*a* respectively via the same way as the first to sixth steps of FIGS. 1-8. The structure of each multilayer substrate 30*a* is the same as the structure of the multilayer substrate 30.

The multilayer substrates 30*a* are peeled off from the supporting plate 40. The multilayer substrates 30*a* are processed to the packaging substrate 100 via the same way as the seventh step of FIGS. 9-10.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A method for manufacturing a packaging substrate, comprising:

patterning a first photo-resisting layer on a copper foil layer, the first photo-resisting layer defining a plurality of first openings to expose portions of the copper foil layer;

patterning a second photo-resisting layer on the first photo-resisting layer, the patterned second photo-resisting layer defining a plurality of second openings exposing the first openings;

filling copper into the first openings and the second openings, with base portions formed in the first openings and a first wiring layer in the second openings;

removing the second photo-resisting layer;

orderly forming a first dielectric layer and a second wiring layer on the first wiring layer;

patterning a third photo-resisting layer on the copper foil layer, the third photo-resisting layer facing away from the first photo-resisting layer, the third photo-resisting layer comprising a plurality of covering portions opposite to the base portions, and a size of each covering portion being less than a size of the corresponding base portion;

etching the copper foil layer to form a plurality of protruding portions connected to the base portions, each of the protruding portions spatially corresponding to a respective one of the base portions, each pair of base portion and protruding portion forming a copper pillar bump, a size of the copper pillar bump gradually increasing from the protruding portions to the base portions; and removing the third photo-resisting layer.

2. The method of claim 1, wherein after the first photo-resisting layer is formed on the copper foil layer and before the second photo-resisting layer is formed on the first photo-resisting layer, a first conductive layer is formed on exposed surfaces of the first photo-resisting layer and the copper foil layer, the second photo-resisting layer is formed on the first conductive layer.

3. The method of claim 2, wherein after the second photo-resisting layer is removed and before the first dielectric layer is formed on the first wiring layer, the first conductive layer covered by the second photo-resisting layer is removed.

4. The method of claim 1, wherein after the first dielectric layer and the second wiring layer are orderly formed on the first wiring layer, the second dielectric layer and the third wiring layer are orderly formed on the second wiring layer.

5. The method of claim 4, wherein after the second dielectric layer and the third wiring layer are orderly formed on the second wiring layer, a solder masking layer is formed on the third wiring layer, parts of the third wiring layer exposing from the solder masking layer server as solder pads.

6. The method of claim 1, wherein after the third photo-resisting layer is removed, the first photo-resisting layer is removed.

7. A method for manufacturing a packaging substrate, comprising:

attaching two copper foil layers on two opposite sides of a supporting plate;

patterning a first photo-resisting layer on each of the copper foil layers, the first photo-resisting layer defining a plurality of first openings to expose portions of each copper foil layer;

patterning a second photo-resisting layer on the first photo-resisting layer, the patterned second photo-resisting layer defining a plurality of second openings exposing the first openings;

filling the first openings and the second openings with copper, with base portions formed in the first openings and a first wiring layer in the second openings;

removing the second photo-resisting layer;

orderly forming a first dielectric layer and a second wiring layer on the first wiring layer to obtain a multilayer substrate, the multilayer substrate comprising the copper foil layer, the first photo-resisting layer, the first wiring layer, the first dielectric layer, and the second wiring layer;

peeling the multilayer substrate off from the supporting plate;

patterning a third photo-resisting layer on the copper foil layer, the third photo-resisting layer facing away from the first photo-resisting layer, the third photo-resisting layer comprising a plurality of covering portions opposite to the base portions, and a size of each covering portion being less than a size of the corresponding base portion;

etching the copper foil layer to form a plurality of protruding portions connected to the base portion, each of the protruding portions spatially corresponding to a respective one of the base portions, each pair of base portion and protruding portion forming a copper pillar bump, a size of the copper pillar bump gradually increasing from the protruding portions to the base portions; and removing the third photo-resisting layer.

8. The method of claim 7, wherein after the third photo-resisting layer is removed, the first photo-resisting layer is removed.

* * * * *